(12) United States Patent
Carlough et al.

(10) Patent No.: US 10,162,773 B1
(45) Date of Patent: Dec. 25, 2018

(54) DOUBLE DATA RATE (DDR) MEMORY READ LATENCY REDUCTION

(71) Applicant: INTERNATIONAL BUSINESS MACHINES CORPORATION, Armonk, NY (US)

(72) Inventors: Steven R. Carlough, Poughkeepsie, NY (US); Susan M. Eickhoff, Hopewell Junction, NY (US); Michael B. Spear, Round Rock, TX (US); Gary A. Van Huben, Poughkeepsie, NY (US); Stephen D. Wyatt, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,285

(22) Filed: Nov. 15, 2017

(51) Int. Cl.
| | |
|---|---|
| *G06F 13/16* | (2006.01) |
| *G11C 7/10* | (2006.01) |
| *G11C 11/4076* | (2006.01) |
| *G06F 5/06* | (2006.01) |

(52) U.S. Cl.
CPC ...... *G06F 13/1689* (2013.01); *G06F 13/1663* (2013.01); *G11C 7/1066* (2013.01); *G06F 5/06* (2013.01); *G11C 11/4076* (2013.01)

(58) Field of Classification Search
CPC .... G06F 13/1689; G06F 13/1663; G06F 5/06; G11C 7/1066; G11C 11/4076

USPC ........................................ 365/189.011–225.7
See application file for complete search history.

(56) References Cited

U.S. PATENT DOCUMENTS

| | | | | | |
|---|---|---|---|---|---|
| 4,954,951 | A | * | 9/1990 | Hyatt ................... | B60R 16/0373 711/218 |
| 5,459,846 | A | * | 10/1995 | Hyatt ................... | B60R 16/0373 711/167 |
| 5,526,506 | A | * | 6/1996 | Hyatt ................... | B60R 16/0373 711/111 |
| 5,602,999 | A | * | 2/1997 | Hyatt ................... | B60R 16/0373 711/1 |
| 2012/0290800 | A1 | | 11/2012 | Krishnan et al. | |
| 2013/0170591 | A1 | | 7/2013 | Su | |
| 2014/0293727 | A1 | | 10/2014 | Nakamura et al. | |
| 2016/0164665 | A1 | | 6/2016 | Taylor et al. | |

\* cited by examiner

*Primary Examiner* — Harry W Byrne
(74) *Attorney, Agent, or Firm* — Cantor Colburn LLP; Bryan Bortnick

(57) ABSTRACT

A system for memory management includes an incoming memory data strobe connecting a memory data interface, and a clock distribution network. The clock distribution network includes an internal clock aligned to the incoming memory data strobe. The system also includes an asynchronous clock domain that is asynchronous with the clock distribution network; and a strobe select circuit configured to align to the incoming memory data strobe. The clock distribution network is configured to propagate read data with reduced latency from the memory data interface to a second interface.

20 Claims, 4 Drawing Sheets

FIG. 2

DOUBLE DATA RATE (DDR) MEMORY READ LATENCY REDUCTION

BACKGROUND

The present invention relates to memory management, and more specifically, to double data rate (DDR) memory read latency reduction.

In a typical memory buffer design read data from synchronous dynamic random-access memory (DRAM) is gated into a memory interface first-in-first-out (FIFO) governed by the timing of the incoming strobes. The data must then be read out of this FIFO for delivery to the host requestor. If the memory interface resides on a disparate memory buffer chip which is connected to the host via a serializer/deserializer (SERDES) interface, then an intermediate data transfer from the memory interface FIFO to the SERDES FIFO is required to serialize the data for transmission on the host channel. These transfers require crossing two, and sometimes three, distinct clock boundaries thereby introducing additional latency in the data return path due to non-optimal clock alignment between the boundaries. Sometimes this additional latency amounts to several memory clock cycles, which can have an appreciable performance impact on read accesses.

SUMMARY

Embodiments of the present invention are directed to a system for memory management. The system includes an incoming memory data strobe connecting a memory data interface, and a clock distribution network. The clock distribution network includes an internal clock aligned to the incoming memory data strobe. The system also includes an asynchronous clock domain that is asynchronous with the clock distribution network; and a strobe select circuit configured to align to the incoming memory data strobe. The clock distribution network is configured to propagate read data with reduced latency from the memory data interface to a second interface.

According to another embodiment, a method for memory management is described. The method includes reading, via a selecting circuit, an incoming memory data strobe, and aligning a clock distribution network comprising an internal clock to the incoming memory data strobe. The system routes non-performance critical logic to an asynchronous clock domain. The asynchronous clock domain is asynchronous with the clock distribution network. The clock distribution network is configured to propagate read data with reduced latency from a memory data interface to a second interface.

According to another embodiment, a computer program product for managing computer memory is described. The computer program product includes a computer readable storage medium having program instructions embodied therewith. The program instructions executable by a processor to cause the processor to perform a method that includes reading, via a selecting circuit, an incoming memory data strobe, and aligning a clock distribution network comprising an internal clock to the incoming memory data strobe. The processor routes non-performance critical logic to an asynchronous clock domain. The asynchronous clock domain is asynchronous with the clock distribution network. The clock distribution network is configured to propagate read data with reduced latency from a memory data interface to a second interface.

DETAILED DESCRIPTION

In a typical memory buffer design (depicted in FIG. 1), read data from synchronous dynamic random-access memory (DRAM) (not shown) is gated into a memory interface first-in-first-out (FIFO) governed by the timing of the incoming strobes. A memory buffer design may include both monolithic memory systems as well as distributed systems (e.g., a load-reduction DIMM (LRDIMM)). The data must then be read out of this FIFO for delivery to the host requestor. If the memory interface resides on a disparate memory buffer chip which is connected to the host via a serializer/deserializer (SERDES) interface, then an intermediate data transfer from the memory interface FIFO to the SERDES FIFO is required to serialize the data for transmission on the host channel. These transfers require crossing two, and sometimes three, distinct clock boundaries thereby introducing additional latency in the data return path due to non-optimal clock alignment between the boundaries. Sometimes this additional latency amounts to several memory clock cycles, which can have an appreciable performance impact on read accesses.

Figure 1:
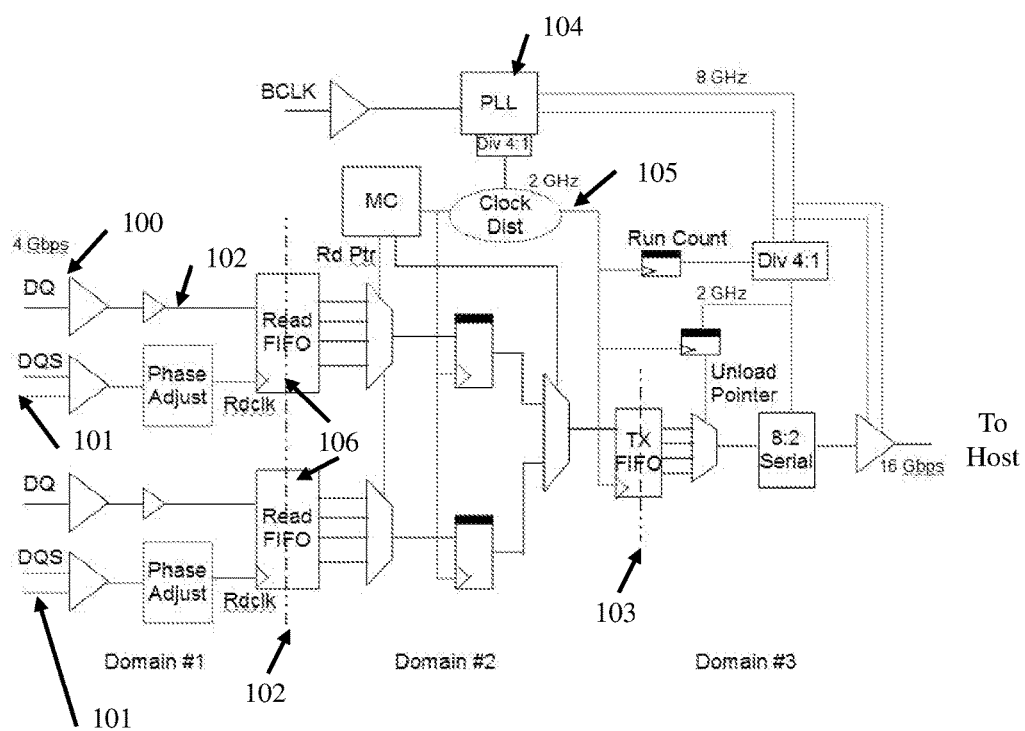
FIG. 1 depicts a traditional implementation of a DDR read path.

FIG. 1 depicts a traditional implementation of a DDR read path on a memory buffer chip. There are three distinct clock boundaries shown in FIG. 1, all within the clocking within a memory buffer chip. The overall task from each of the boundaries (shown as Domain #1, Domain #2, and Domain #3) is to pass data coming in from the memory (which has its own clock, i.e., the memory strobe 101 depicted in FIG. 1 as DQS 101) and passing it through the internal chip clock boundary 102 (from phase locked loop (PLL) 104 driven by input broadcasted clock (BCLK)) into the high speed domain 103 (from a third PLL (not shown)) to be passed back up to the host. In some embodiments the PLL for high speed domain 103 may be the same PLL used for a RX High speed receiver (not shown) driven by the RX clock recovery circuits used to reconstruct a clock from the edges of data value transitions. In other embodiments the PLL for high speed domain 103 may be sourced from the Clock Distribution of domain 2. In these cases the high clock frequencies and short serialization times (used to minimize latency) require a Domain 3 that is not in phase with Domain 2 to close the target frequency of the design. These three boundaries, have clock domain crossings (internal chip clock boundary 102) that are out of sync (or out of phase) with each other. Because the memory is gating data with the strobe DQS 101 from the DRAMs, that strobe is not always perfectly aligned with the BCLK input. Thus the Read FIFOs 106 hold the bits written on a Domain 1 clock and holds them until they can be properly read from a Domain 2 clock The alignment is complete, when the data is read out of the read FIFOs 106 by the Domain 2 clock. This generally takes 1-2 cycles to take place for the data to properly settle. All the data (for all bytes of the memory), which may be 9-10 bytes in some cases, must be read out simultaneously on the Domain 2 clock. The lay-over gets added directly to the overall system latency.

In some systems a High Speed SERDES transmitter and receiver (not shown) are used to send the data back to the host over high frequency nets (ie. 16 Gpbs shown in FIG. 1). A PLL (not shown) in the receiver creating Domain 3. Data from Domain 2 is written with the Domain 2 clock into TX FIFO 103. TX FIFO 103 holds the data until it can be properly read from a Domain 3 clock. The alignment is complete, when the data is read out of the read TX FIFO 103 by the domain 3 clock. This generally takes 1-2 cycles to take place for the data to properly settle. These cycles for aligning the data from Domain 2 to Domain 3 gets added directly to the overall system latency.

In a memory sub-system that includes a memory buffer chip interfacing between synchronous DRAMs connected to a DDR interface and connected to a host via a SERDES interface, the earlier-described latency impact on the returning read data can exist in a distributed memory buffer structure and even when using a monolithic buffer chip. Even with a monolithic buffer chip, there exists a need to optimize the phase of the chip clock with respect to the a High Speed (HS) SERDES Receiver (RX) and Transmitter (TX) (referred to herein as HSS RX and HSS TX, respectively). The HSS interface is how the memory buffer chip communicates to the host. In a monolithic buffer chip, there are two unidirectional interfaces running at high frequency using a packeted protocol. In the command path, the HSS RX (the receiver physical I/O interface) is used to de-serialize the downstream packets into what ultimately becomes a memory command to send to the DRAMs. Optimization is needed with respect to phase to minimize the latency on the outgoing read command, but this can be at odds with also trying to optimize that same chip clock with the incoming data strobe and HSS TX FIFO. On monolithic buffer chips, it is not uncommon to have two or more PLLs driving separate internal clock distributions which ultimately affect the end to end phase relationships of the outgoing command and returning read data paths.

Conventional approaches tend to pad the unload time with 1 or 2 memory clocks as a safeguard to ensure the data stability. This conservative approach can wind up adding latency by using a "one size fits all" solution for all parts and all power-on invocations, whereas embodiments described herein adapt the read clock alignment based on the current strobe alignment, which can vary between DRAM die, or even within the same die between power on sequences.

As a brief overview, aspects of the present invention optimize the returning read data path by introducing a dedicated read data clock which is established at the conclusion of memory interface training. In some aspects, the present invention minimizes the load versus unload time of the DDR FIFO by using the phase of the latest arriving read data strobe to establish the read data clock. Memory buffer chips often have memory interfaces that include a plurality of nibbles or bytes, and depending on the topology of the dual inline memory module (DIMM) or memory card, there can be wiring differences between the nibbles and bytes. This often manifests as skew among the incoming read data strobes, (such as strobes 100 and 101 shown with respect to FIG. 1). Further strobe variation can be introduced between the nibbles/bytes by way of the tDQSCK (a JEDEC Specification) timing specification for DRAMs. By comparing the arrival times for all incoming strobes, and formulating the read clock based on the latest, guarantees proper data stability prior to unloading the DDR FIFO.

Figure 2:
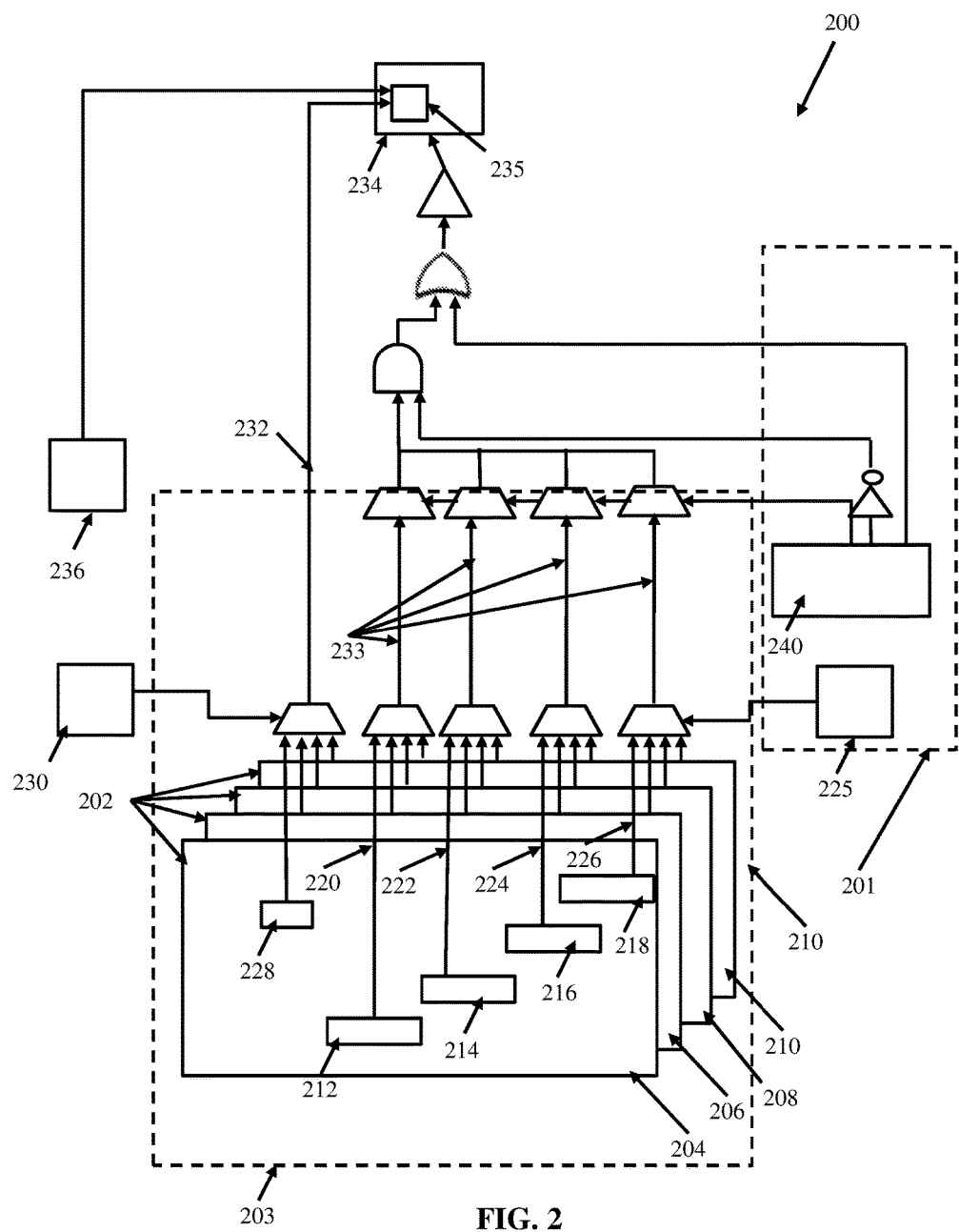
FIG. 2 depicts a system for managing memory according to one exemplary embodiment.

FIG. 2 depicts a system 200 for managing memory, according to embodiments described herein. System 200 includes two distinct domains: a local domain 201 configured for internal non-performance critical logic, and a second clock domain 203 that includes a dedicated read clock distribution network 202 (hereafter "clock distribution network 202") dedicated just for the memory read path. According to embodiments of the present invention, the local domain 201 may be asynchronous with respect to the second clock domain 203, which includes a synchronous data path.

The clock distribution network 202 includes a plurality of DDR ports 204, 206, 208, and 210. Each of the DDR ports 204-210 in the clock distribution network 202 are memory ports that include a plurality set of DDR Read FIFO lanes, for example, DDR Read FIFO lanes 212, 214, 216, and 218. FIFO lanes 212-218 output read data buses 220, 222, 224, and 226, respectively.

The clock distribution network 202 further includes a DQS read clock 228, a high speed serializer (HSS) 234, and a strobe detecting circuit 230. The HSS 234 includes a 4-to-1 dividing (DIV4) clock 235. The DQS read clock 228 is included in the clock distribution network 202. The function of the DQS read clock 228 is to establish read data strobe alignment.

Once the DQS read clock 228 is established and "tuned" to the incoming read data strobes 101, the DQS read clock 228 is then used to preset the phase of the HSS TX DIV4 clock divider and serializer (235, 234, respectively). This eliminates the need for an HSS FIFO (as depicted in FIG. 1), because system 200 creates a fully synchronous path 232 from the DDR FIFO output 233 to the HSS 234. DDR FIFO output 233 is configured to select between the DDR read data which is traveling on this highly synchronized low latency path and data emanating from BCOM interface 240. For example, if the chip has any error/status information residing in a register that the host needs to query, then it would come out of this BCOM interface 240. Now a synchronous system from strobes 220-226 through the internal clock 228 that is driving the read pointer out of the FIFOs lanes 212-218, and further driving the local clock 236 for the HSS 234. Depending on size of the memory buffer chip and operating frequency, additional staging latches (not shown) may or may not be included for pipe lining, but otherwise no additional latency is needed to protect against clock boundary crossings.

Since the read clock distribution network 202 is self-contained within the read data flow, it can be applied to any type of memory sub-system connected to a host via an HSS interface, and involving a read data tag host protocol, including a monolithic or distributed memory buffer topology. Aspects of the present invention permit this approach to be applied to a distributed memory buffer structure that includes an Address/Command (AC) chip (not shown) for processing command/address/control (cmd/addr/cntl) information and one or more Data Chips (DCs) (not shown) for processing data. In this structure, the DC chip clock is derived from a bus clock (BCLK) sourced from the AC chip.

According to another embodiment, a read clock 228 is created in addition to the local DC chip clock 236 as a separate clock distribution, which is dedicated solely for delivering read data from the memory interface to the HSS 234. A second data flow driven by the DC chip clock (BCLK) 236 would be used for receiving operations from the AC chip (not shown). Since there is no guaranteed alignment between the read clock 228 and the local chip clock 236 domain, this second data flow is treated as an asynchronous boundary with appropriate metastability protection when crossing from the secondary data flow into the primary data flow.

Another aspect of the present invention, a physical input/output interface (BCOM interface 240) is configured from the AC chip to the DC chips to convey command information to enact read, write or register access operations. The BCOM interface 240 is the physical circuitry responsible for transmitting and receiving the information to and from the chip. In the case of the HSS, it represents the I/O and serial/de-serial circuitry along with the necessary clocking support. For the DDR, it represents the I/O circuitry as well as the data FIFOs and strobe and clocking support needed to properly align and capture the incoming data safely into the FIFO.

According to aspects of the present invention, BCOM interface 240 is configured as a path way for any data internal to the chip that may need to be accessed by the host, but is not performance critical data. In the case of a memory read, the typical DRAM read latency is greater than 10 memory clock cycles thereby allowing sufficient time to convey the necessary information across the BCOM interface and traverse any asynchronous or metastability stages ahead of the returning memory data. The BCOM interface is typically used to configure the physical I/O interfaces (100 and 101) that receive the DDR data to enable the appropriate delay registers to capture the incoming data and strobes 220-226. The data needs to be meta-stabilized before it can be routed through the DDR FIFO output 233 muxes.

Figure 3:
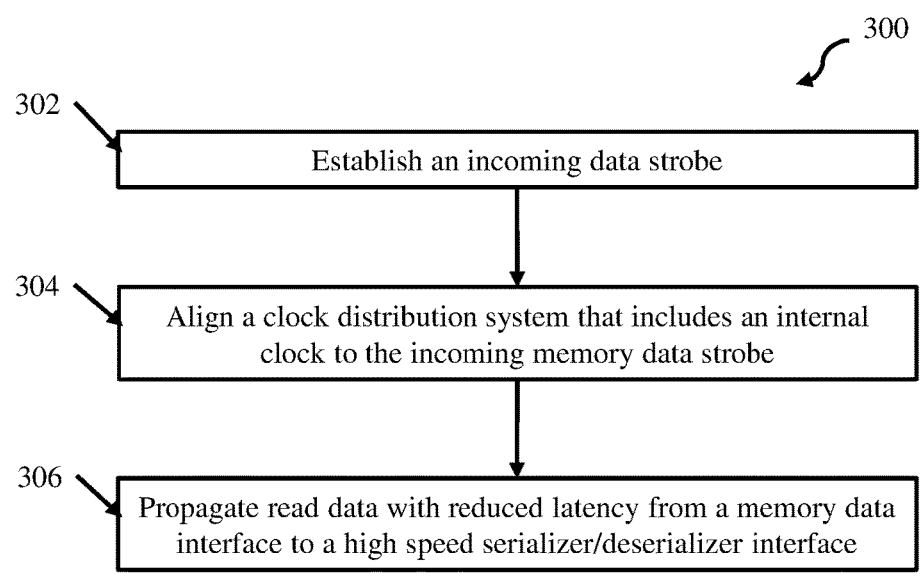
FIG. 3 depicts a flow diagram of a method for managing computer memory according to one exemplary embodiment.

FIG. 3 depicts a flow diagram of a method 300 for managing computer memory, according to one exemplary embodiment. Method 300 is said to be performed by system 200, depicted in FIG. 2. Considering both FIGS. 2 and 3, as shown in FIG. 3 at block 302 system 200 establishes an incoming data strobe (e.g., one or more of data strobes 220-226). According to one embodiment, the data strobe (220-226) is established by a selecting circuit 225 connected to the incoming memory data strobe 220-226.

At block 304, system 200 aligns a clock distribution network 202 that includes an internal clock 228. In one aspect, the system 200 aligns the clock distribution network 202 with the internal clock 228 via a computer program product stored on a connected computer memory (422, 402). The clock distribution network 202 is aligned to the incoming memory data strobes 220-226 by identifying the last-arriving strobe (e.g., one of 220-226), and after identifying the last-arriving strobe, self-aligning to the last-arriving strobe.

In another aspect, the system 200 aligns the clock distribution network 202 using the strobe detecting circuit 230. Accordingly, the strobe detecting circuit 230 is a dedicated circuit selects the last-arriving strobe and performs the self-alignment.

At block 306, system 200 propagates read data with reduced latency from a memory data interface to a second interface. The second interface (HSS 234), in some aspects, can be a high speed serializer/deserializer SERDES interface.

Figure 4:
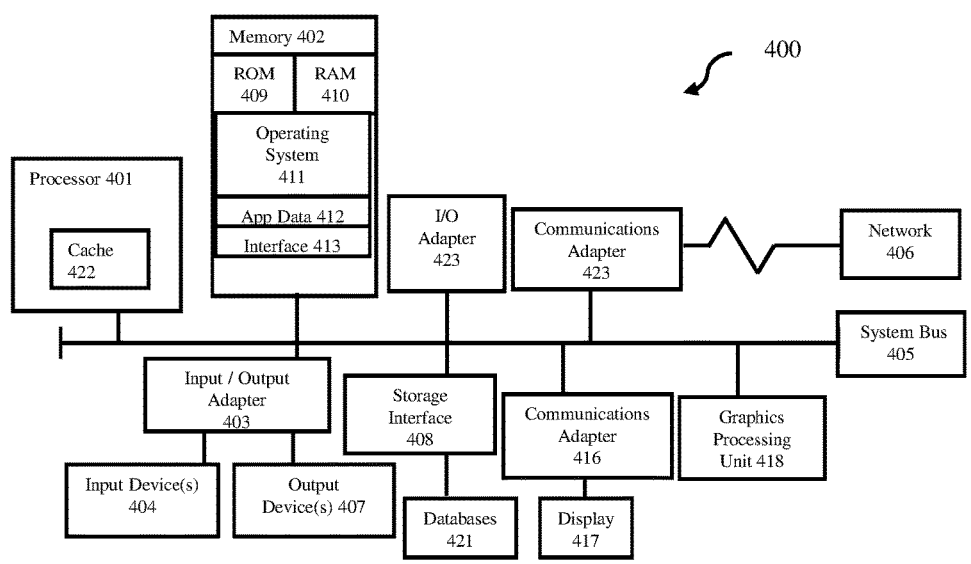
FIG. 4 depicts an exemplary computing system for implementing one or more embodiments described herein.

FIG. 4 illustrates a block diagram of an exemplary computing environment and computer system 400 for use in practicing the embodiments described herein. The environment and system described herein can be implemented in hardware, software (e.g., firmware), or a combination thereof. In an exemplary embodiment, a hardware implementation can include a microprocessor of a special or general-purpose digital computer, such as a personal computer, workstation, minicomputer, or mainframe computer. Computer 400, therefore, can embody a general-purpose computer. In another exemplary embodiment, the implementation can be part of a mobile device, such as, for example, a mobile phone, a personal data assistant (PDA), a tablet computer, etc.

As shown in FIG. 4, the computer 400 includes processor 401. Computer 400 also includes memory 402 communicatively coupled to processor 401, and one or more input/output adapters 403 that can be communicatively coupled via system bus 405. Memory 402 can be communicatively coupled to one or more internal or external memory devices via a storage interface 408. Communications adapter 416 can communicatively connect computer 400 to one or more networks 406. System bus 405 can communicatively connect one or more user interfaces via input/output (I/O) adapter 403. I/O adapter 403 can connect a plurality of input devices 404 to computer 400. Input devices can include, for example, a keyboard, a mouse, a microphone, a sensor, etc. System bus 405 can also communicatively connect one or more output devices 407 via I/O adapter 403. Output device 407 can include, for example, a display, a speaker, a touchscreen, etc.

Processor 401 is a hardware device for executing program instructions (aka software), stored in a computer-readable memory (e.g., memory 402). Processor 401 can be any custom made or commercially available processor, a central processing unit (CPU), a plurality of CPUs, an auxiliary processor among several other processors associated with the computer 400, a semiconductor based microprocessor (in the form of a microchip or chip set), or generally any device for executing instructions. Processor 401 can include a cache memory 422, which can include, but is not limited to, an instruction cache to speed up executable instruction fetch, a data cache to speed up data fetch and store, and a translation lookaside buffer (TLB) used to speed up virtual-to-physical address translation for both executable instructions and data. Cache memory 422 can be organized as a hierarchy of more cache levels (L1, L2, etc.).

Processor 401 can be disposed in communication with one or more memory devices (e.g., RAM 409, ROM 410, one or more external databases 421, etc.) via a storage interface 408. Storage interface 408 can also connect to one or more memory devices including, without limitation, one or more databases 421, and/or one or more other memory drives (not shown) including, for example, a removable disc drive, etc., employing connection protocols such as serial advanced technology attachment (SATA), integrated drive electronics (IDE), IEEE-1394, universal serial bus (USB), fiber channel, small computer systems interface (SCSI), etc. The memory drives can be, for example, a drum, a magnetic disc drive, a magneto-optical drive, an optical drive, a redundant array of independent disks (RAID), a solid-state memory device, a solid-state drive, etc. Variations of memory devices can be used for implementing, for example, list all databases from other figures.

Memory 402 can include random access memory (RAM) 409 and read only memory (ROM) 410. RAM 409 can be any one or combination of volatile memory elements (e.g., DRAM, SRAM, SDRAM, etc.). ROM 410 can include any one or more nonvolatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, memory 402 can incorporate electronic, magnetic, optical, and/or other types of non-transitory computer-readable storage media.

Memory 402 can also be a distributed architecture, where various components are situated remote from one another, but can be accessed by processor 401.

The instructions in memory 402 can include one or more separate programs, each of which can include an ordered listing of computer-executable instructions for implementing logical functions. In the example of FIG. 4, the instructions in memory 402 can include an operating system 411. Operating system 411 can control the execution of other computer programs and provides scheduling, input-output control, file and data management, memory management, and communication control and related services. The program instructions stored in memory 402 can further include application data 412, and for a user interface 413.

I/O adapter 403 can be, for example but not limited to, one or more buses or other wired or wireless connections. I/O adapter 403 can have additional elements (which are omitted for simplicity) such as controllers, microprocessors, buffers (caches), drivers, repeaters, and receivers, which can work in concert to enable communications. Further, I/O adapter 403 can facilitate address, control, and/or data connections to enable appropriate communications among the aforementioned components.

I/O adapter 403 can further include a display adapter coupled to one or more displays. I/O adapter 403 can be configured to operatively connect one or more input/output (I/O) devices 407 to computer 400. For example, I/O 403 can connect a keyboard and mouse, a touchscreen, a speaker, a haptic output device, or other output device. Output devices 407 can include but are not limited to a printer, a scanner, and/or the like. Other output devices can also be included, although not shown. Finally, the I/O devices connectable to I/O adapter 403 can further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like.

According to some embodiments, computer 400 can include a mobile communications adapter 423. Mobile communications adapter 423 can include GPS, cellular, mobile, and/or other communications protocols for wireless communication.

In some embodiments, computer 400 can further include communications adapter 416 for coupling to a network 406.

Network 406 can be an IP-based network for communication between computer 400 and any external device. Network 406 transmits and receives data between computer 400 and devices and/or systems external to computer 400. In an exemplary embodiment, network 406 can be a managed IP network administered by a service provider. Network 406 can be a network internal to an aircraft, such as, for example, an avionics network, etc. Network 406 can be implemented in a wireless fashion, e.g., using wireless protocols and technologies, such as WiFi, WiMax, etc. Network 406 can also be a wired network, e.g., an Ethernet network, an ARINC 429 network, a controller area network (CAN), etc., having any wired connectivity including, e.g., an RS232 connection, R5422 connection, etc. Network 406 can also be a packet-switched network such as a local area network, wide area network, metropolitan area network, Internet network, or other similar type of network environment. The network 406 can be a fixed wireless network, a wireless local area network (LAN), a wireless wide area network (WAN) a personal area network (PAN), a virtual private network (VPN), intranet or other suitable network system.

Network 406 can operatively connect computer 400 to one or more devices including device 417 and device 418. Network 406 can also connect computer 400 to one or more servers.

If computer 400 is a PC, workstation, laptop, tablet computer and/or the like, the instructions in the memory 402 can further include a basic input output system (BIOS) (omitted for simplicity). The BIOS is a set of routines that initialize and test hardware at startup, start operating system 411, and support the transfer of data among the operatively connected hardware devices. The BIOS is typically stored in ROM 410 so that the BIOS can be executed when computer 400 is activated. When computer 400 is in operation, processor 401 can be configured to execute instructions stored within the memory 402, to communicate data to and from the memory 402, and to generally control operations of the computer 400 pursuant to the instructions.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for memory management comprising:
   an incoming memory data strobe connecting a memory data interface;
   a clock distribution network comprising an internal clock aligned to the incoming memory data strobe;
   an asynchronous clock domain that is asynchronous with the clock distribution network; and
   a strobe select circuit configured to align to the incoming memory data strobe;
   wherein the clock distribution network is configured to propagate read data with reduced latency from the memory data interface to a second interface.

2. The system of claim 1, wherein the second interface contains no first-in first-out (FIFO) buffer.

3. The system of claim 1, wherein the clock distribution network is aligned to the incoming memory data strobe by identifying a last-arriving strobe; and
   after identifying the last-arriving strobe, self-aligning to the last-arriving strobe.

4. The system of claim 3, further comprising a computer-readable memory storing an embedded program configured to identify the last-arriving strobe and self-align to the strobe.

5. The system of claim 3, further comprising a dedicated circuit configured to identify the last-arriving strobe and self-align to the strobe.

6. The system of claim 1, wherein the clock distribution network forms an end-to-end synchronous path.

7. The system of claim 1, wherein the second interface is a high speed serializer/deserializer SERDES interface.

8. The system of claim 1, wherein the memory data interface comprises a distributed memory buffer topology.

9. The system of claim 1, wherein the memory data interface comprises a monolithic memory buffer topology.

10. A method of managing computer memory comprising:
    reading, via a selecting circuit, an incoming memory data strobe;
    aligning a clock distribution network comprising an internal clock to the incoming memory data strobe; and
    routing non-performance critical logic to an asynchronous clock domain, wherein the asynchronous clock domain is asynchronous with the clock distribution network;

wherein the clock distribution network configured to propagate read data with reduced latency from a memory data interface to a second interface.

11. The method of claim 10, wherein the second interface contains no first-in first-out (FIFO) buffer.

12. The method of claim 10, wherein the clock distribution network is aligned to the incoming memory data strobe by identifying a last-arriving strobe; and after identifying the last-arriving strobe, self-aligning to the last-arriving strobe.

13. The method of claim 12, further comprising storing an embedded program configured to identify the last-arriving strobe and self-align to the strobe in a computer-readable memory.

14. The method of claim 12, further comprising identifying, via a dedicated circuit, the last-arriving strobe and self-aligning to the strobe.

15. The method of claim 10, wherein the clock distribution network forms an end-to-end synchronous path.

16. The method of claim 10, wherein the second interface is a high speed serializer/deserializer SERDES interface.

17. The method of claim 10, wherein the memory data interface comprises a distributed memory buffer topology.

18. The method of claim 10, wherein the memory data interface comprises a monolithic memory buffer topology.

19. A computer program product for managing computer memory, the computer program product comprising a computer readable storage medium having program instructions embodied therewith, the program instructions executable by a processor to cause the processor to perform a method comprising:

aligning a clock distribution network comprising an internal clock to the incoming memory data strobe; and routing non-performance critical logic to an asynchronous clock domain, wherein the asynchronous clock domain is asynchronous with the clock distribution network;

wherein the clock distribution network configured to propagate read data with reduced latency from a memory data interface to a second interface.

20. The computer program product of claim 19, wherein the second interface contains no first-in first-out (FIFO) buffer.

* * * * *